United States Patent [19]

Yamada

[11] Patent Number: 5,159,573
[45] Date of Patent: Oct. 27, 1992

[54] APPARATUS FOR CONTROLLING OUTPUTS OF READ DATA IN A SEMICONDUCTOR MEMORY DEVICE

[75] Inventor: Yasumasa Yamada, Tokyo, Japan
[73] Assignee: NEC Corporation, Tokyo, Japan
[21] Appl. No.: 610,885
[22] Filed: Nov. 9, 1990

[30] Foreign Application Priority Data

Nov. 9, 1989 [JP] Japan .................... 1-292776

[51] Int. Cl.[5] .................... G11C 7/00; G11C 8/00
[52] U.S. Cl. .................... 365/233.5; 365/233; 365/189.01; 365/189.05; 365/189.08
[58] Field of Search .......... 365/233.5, 189.05, 189.01, 365/191, 189.08, 233, 218

[56] References Cited

U.S. PATENT DOCUMENTS

| | | | |
|---|---|---|---|
| 4,672,587 | 6/1987 | Geiger et al. | 365/230.01 |
| 4,858,188 | 8/1989 | Kobayashi | 365/189.05 |
| 4,891,793 | 1/1990 | Anami | 365/204 |
| 4,894,803 | 1/1990 | Aizaki | 365/189.05 |
| 4,903,240 | 2/1990 | Von Flue | 365/189.02 |
| 4,908,796 | 3/1990 | Lee et al. | 365/189.05 |
| 4,928,265 | 5/1990 | Higuchi et al. | 365/189.05 X |
| 4,972,374 | 11/1990 | Wang et al. | 365/205 |
| 5,025,422 | 6/1991 | Moriwaki et al. | 365/233.5 |

Primary Examiner—Alyssa H. Bowler
Attorney, Agent, or Firm—Sughrue, Mion, Zinn, Macpeak & Seas

[57] ABSTRACT

An apparatus for controlling outputs of read data in a semiconductor memory device, includes a plurality of output circuits, through which read data are supplied to an external circuit, an output controlling circuit which controls output operation of the output circuits, an address change detecting circuit which supplies an address detecting signal to the output controlling circuit, and a timing controlling circuit which controls the timing by which an output controlling signal of the output controlling circuit is supplied to the output circuits. The timing controlling circuit controls the timing of discharge in the output terminals of the output circuits, so that the discharge occurs in the output circuits sequentially with a predetermined time interval. Consequently, noise which affects the output circuits' ability to receive read data is prevented during discharge.

4 Claims, 4 Drawing Sheets

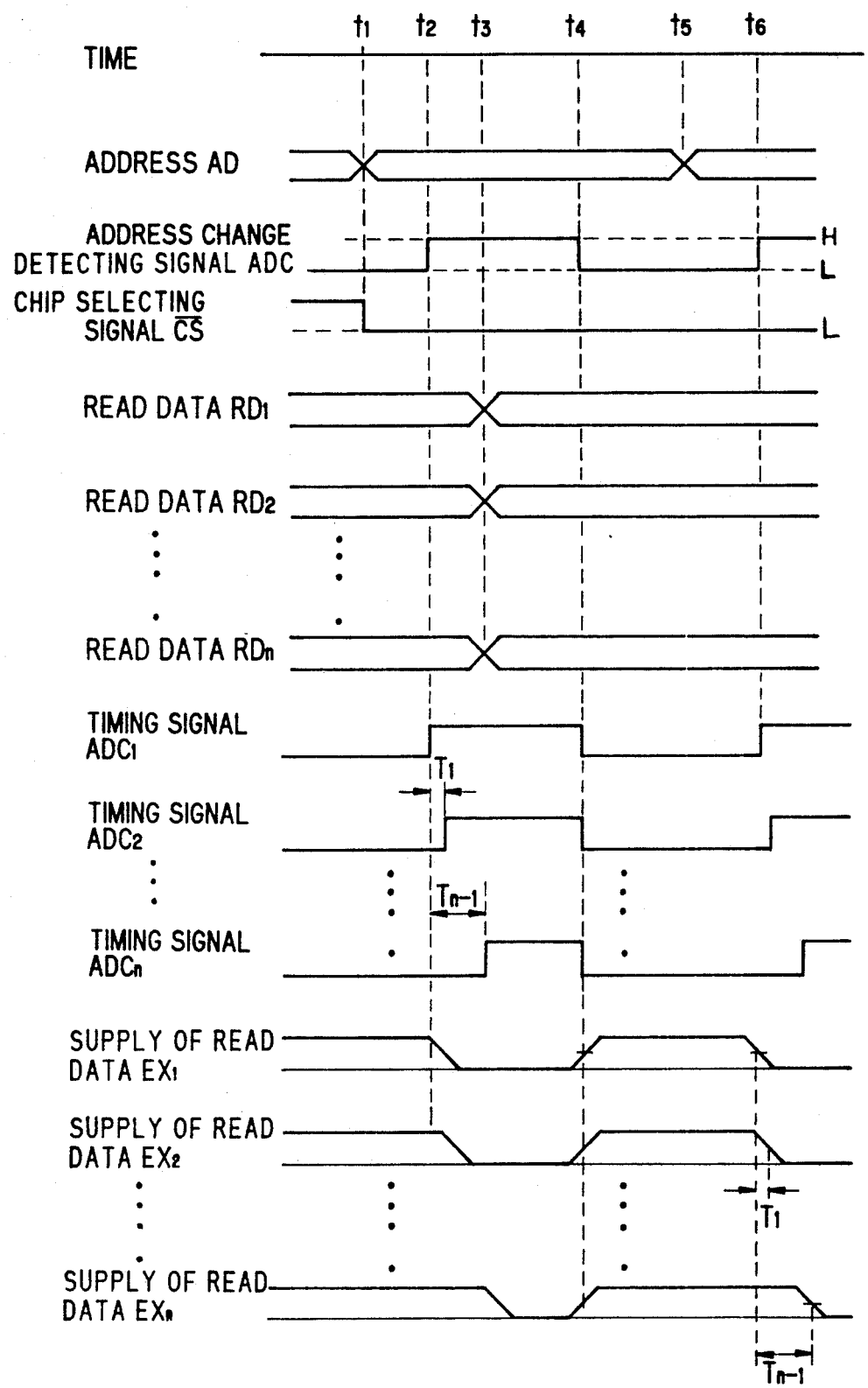

1

APPARATUS FOR CONTROLLING OUTPUTS OF READ DATA IN A SEMICONDUCTOR MEMORY DEVICE

FIELD OF THE INVENTION

This invention relates to an apparatus for controlling outputs of read data in a semiconductor memory device, and more particularly to a semiconductor memory device with a plurality of output circuits which supply read data to an external circuit.

BACKGROUND OF THE INVENTION

A conventional semiconductor memory device comprises a plurality of output circuits which supply read data to an external circuit in accordance with a chip selecting signal, an address change detecting signal and an output controlling signal, an output controlling circuit which controls output operations of the output circuits by supplying the output controlling signal to the output circuits, and an address change detecting circuit which detects an address change to supply information of the address change to the output controlling circuit and the output circuits.

In operation, the semiconductor memory device is selected to operate, when the low-active chip selecting signal turns to a low level. When the address change is detected in this state, the address change detecting circuit supplies an address change detecting signal to the output controlling circuit, which in turn supplies an output controlling signal to the output circuits. Thus, discharge of the output terminals is carried out in the output circuits, simultaneously. After that, the read data are supplied through the the output circuits to the external circuit.

However, the conventional apparatus for controlling outputs of read data in a semiconductor memory device has a disadvantage in that noise may be produced when a large amount of current flows in the simultaneous discharge of the output circuits, if many of the output terminals thereof are in a high level state.

SUMMARY OF THE INVENTION

Accordingly, it is an object of the invention to provide an apparatus for controlling outputs of read data in a semiconductor memory device which produces no noise during the discharge of the output terminals of the output circuits even in the condition that the number of the output terminals of a high level state is large.

According to the invention, an apparatus for controlling outputs of read data in a semiconductor memory device comprises, a plurality of output circuits for supplying read data which are read from a memory to an external circuit; and means for controlling the output circuits to discharge charge of the output circuits sequentially with a predetermined time interval, the charge being accumulated by read data of a high level formerly supplied to the external circuit.

BRIEF DESCRIPTION OF THE DRAWINGS

The invention will be explained in more detail in conjunction with appended drawings, wherein:

FIG. 4 is a timing chart showing operations the apparatus for controlling outputs of read data in a semiconductor memory device in the preferred embodiment according to the invention.

DESCRIPTION OF THE PREFERRED EMBODIMENTS

Before describing an apparatus for controlling outputs of read data in a semiconductor memory device according to the invention, the conventional apparatus for controlling outputs of read data in a semiconductor memory device briefly described before will be explained in conjunction with FIGS. 1 and 2.

Figure 1:
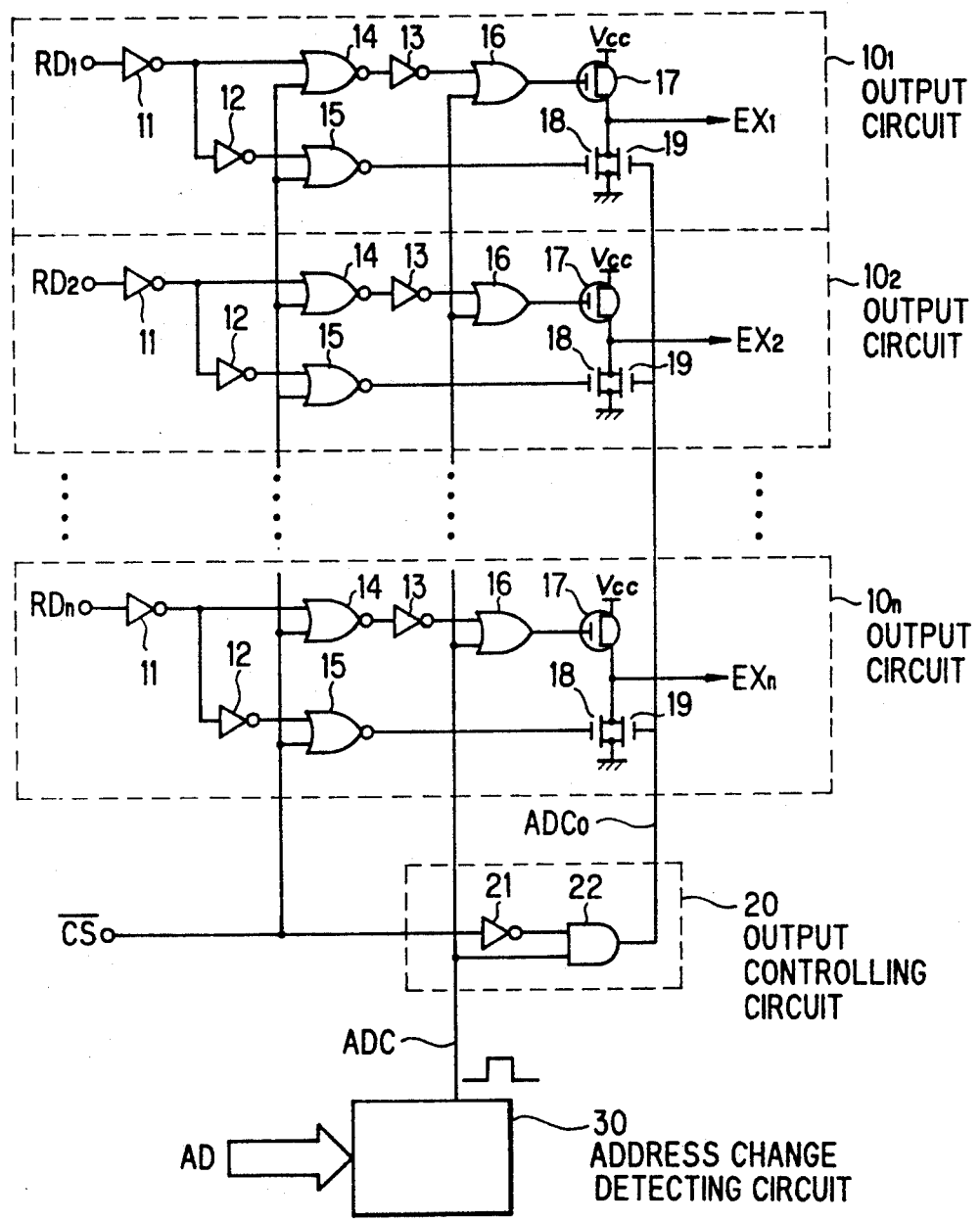
FIG. 1 is a circuit diagram showing a conventional apparatus for controlling outputs of read data in a semiconductor memory device.

FIG. 1 shows the conventional apparatus for controlling outputs of read data in a semiconductor memory device. The apparatus for controlling outputs of read data in a semiconductor memory device comprises a plurality of output circuits $10_1$, $10_2$, $\sim$, $10_n$ which are supplied with read data from a memory, an output controlling circuit 20 which controls output operation of the output circuits $10_1$, $10_2$, $\sim$, $10_n$, and an address change detecting circuit 30 which supplies an address change detecting signal ADC to the output controlling circuit 20.

Every circuit of the output circuits $10_1$, $10_2$, $\sim$, $10_n$ comprises inverters 11, 12 and 13, NOR circuits 14 and 15, an OR circuit 16, a P-MOS transistor 17, and N-MOS transistors 18 and 19. The inverter 11 receives a corresponding bit $RD_k$ ($k=1, 2, \ldots, n$) of read data to invert a logic level of the input thereof. The inverter 12 receives the output of the inverter 11 to invert a logic level thereof. The NOR circuit 14 produces a NOR logic output from the output of the inverter 11 and a chip selecting signal $\overline{CS}$. The NOR circuit 15 produces a NOR logic output from the output of the inverter 12 and the chip selecting signal $\overline{CS}$. The inverter 13 inverts a logic level of the output of the NOR circuit 14. The OR circuit 16 produces an OR logic output from the output of the inverter 13 and the address change detecting signal ADC of the address change detecting circuit 30. The P-MOS transistor 17 is connected at a source terminal to a power supply $V_{cc}$, and at a gate terminal to the output of the OR circuit 16. The P-MOS transistor 17 and the N-MOS transistors 18 and 19 are connected with one another at drain terminals to an output terminal which produces a corresponding output signal $EX_k$ ($k=1, 2, \ldots, n$). The N-MOS transistors 18 and 19 are connected together at source terminals to ground. The N-MOS transistor 18 is connected at a gate terminal to the output of the NOR circuit 15. The N-MOS transistor 19 is connected at a gate terminal to the output controlling circuit 20.

The output controlling circuit 20 comprises an inverter 21 which inverts a logic level of the chip selecting signal $\overline{CS}$, and an AND circuit 22 which produces an output controlling signal $ADC_o$ from the output of the inverter 21 and the address change detecting signal ADC. The output controlling signal $ADC_o$ is supplied to the gate terminals of the N-MOS transistors 19.

The address change detecting circuit 30 receives an address signal AD to produce the address change detecting signal ADC as a one shot pulse when the address signal changes.

Figure 2:
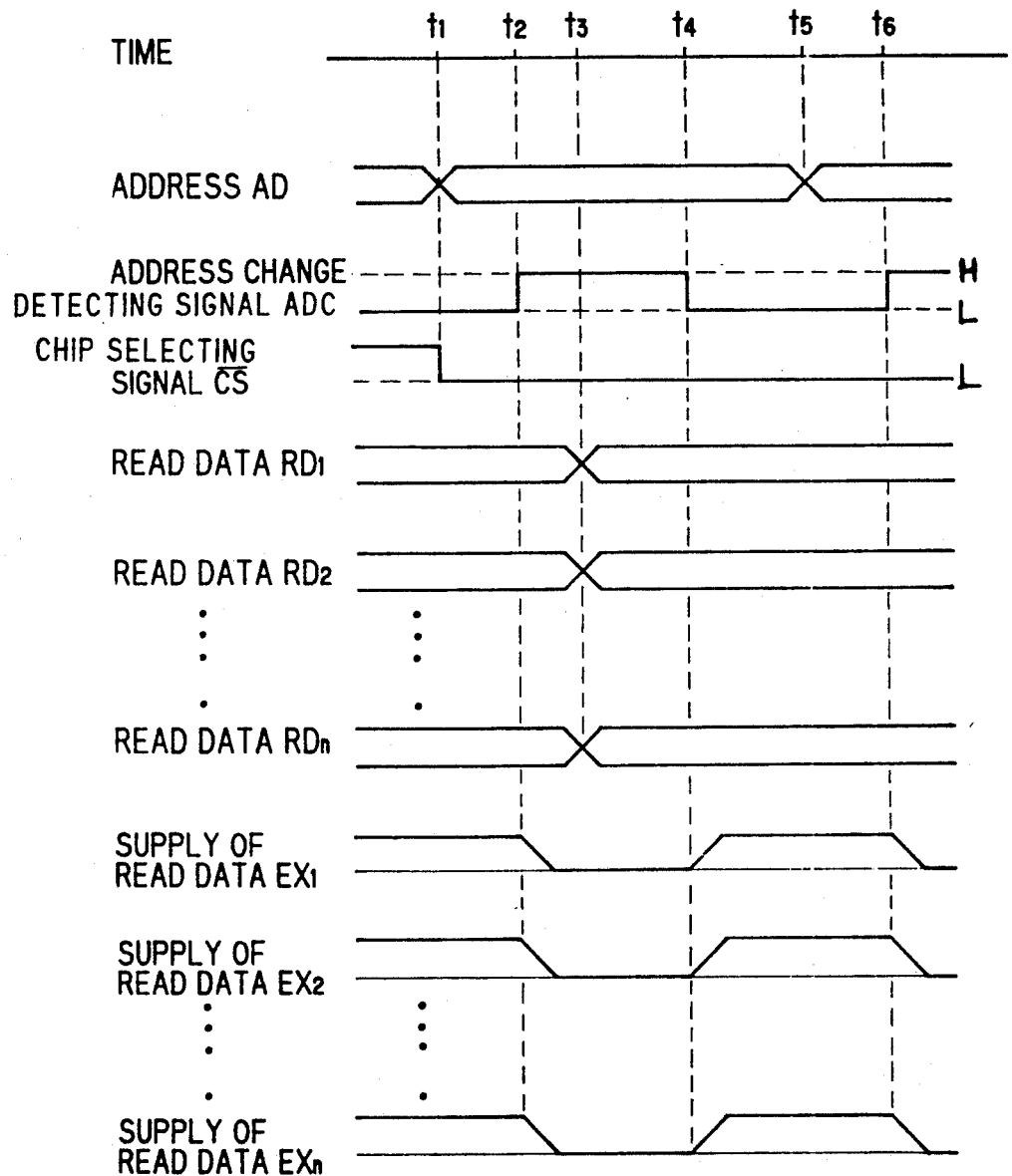
FIG. 2 is a timing chart showing operations the conventional apparatus for controlling outputs of read data in a semiconductor memory device.

FIG. 2 shows operations of the conventional semiconductor memory device.

The semiconductor memory device is selected to operate, when the chip selecting signal $\overline{CS}$ turns to a low level at the time $t_1$ to remain at a low level. At this state, when the address signal AD changes, the address change detecting circuit 30 detects the change thereof to produce the address change detecting signal ADC of a high level at the time $t_2$. The signal ADC remains at a high level during a period between the times $t_2$ and $t_4$, so that the output controlling signal $ADC_o$ of the output controlling circuit 20 turns to a high level. As a result, the N-MOS transistor 19 turns to an ON state to carry out discharge of the output terminals of the output circuits $10_1, 10_2, \sim, 10_n$. At this time, noises may be produced because a large amount of current flows when many of the output terminals thereof are in a high level and because discharge of the output terminals thereof are carried out simultaneously.

Then, the read data $RD_k$ ($k=1, 2, \ldots, n$) is supplied to the input of the inverter 11 of the corresponding circuit of the output circuits $10_1, 10_2, \sim, 10_n$. When the address change detecting signal ADC turns to a low level at the time $t_4$, the N-MOS transistor 19 turns to an OFF state. On the other hand, the chip selecting signal $\overline{CS}$ is maintained to be a low level, so that the output signals $EX_1, EX_2, \sim, EX_n$ corresponding to the read data $RD_1, RD_2, \sim, RD_n$ are supplied to the external circuit. That is, the outputs of each of the circuit elements are indicated below, when the read data $RD_k$ ($k=1, 2, \ldots, n$) is "high" in one of the output circuits $10_k$ ($k=1, 2, \sim, n$).

the same as that in FIG. 1, except that N-MOS transistor 19 is connected at a gate terminal to a corresponding output of the timing controlling circuit 40.

The output controlling circuit 20 comprises an inverter 21 which inverts a logic level of the chip selecting signal $\overline{CS}$, and an AND circuit 22 which produces an output controlling signal $ADC_0$ from the output of the inverter 21 and the address change detecting signal ADC. The output controlling signal $ADC_0$ is supplied to the timing controlling circuit 40.

The address change detecting circuit 30 receives an address signal AD to produce the address change detecting signal ADC of a one shot pulse when the address signal changes.

The timing controlling circuit 40 comprises a plurality of AND circuits $40_1, 40_2, \sim, 40_n$. The AND circuit $40_1$ produces a timing controlling signal $ADC_1$ from the output controlling signal $ADC_0$ received at two input terminals, so that the logic level of the output signal $ADC_1$ is equal to that of the input signal $ADC_0$. The AND circuit $40_2$ produces a timing controlling signal $ADC_2$ from the output signal $ADC_0$ and the timing controlling signal $ADC_1$, and so on, then the AND circuit $40_n$ produces a timing controlling signal $ADC_n$ from $ADC_0$ and $ADC_{n-1}$.

FIG. 4 shows operation of the semiconductor memory device according to the preferred embodiment according of the invention.

The semiconductor memory device is selected to operate, when the chip selecting signal $\overline{CS}$ turns to a low level at the time $t_1$ to remain at a low level. At this state, when the address signal AD changes, the address change detecting circuit 30 detects the address change to produce the address change detecting signal ADC of

| $RD_k$ | INVERTER | INVERTER | NOR | NOR | INVERTER | OR | P-MOS | N-MOS | N-MOS | $EX_k$ |
|---|---|---|---|---|---|---|---|---|---|---|
| 1 | 0 | 1 | 1 | 0 | 0 | 0 | ON | OFF | OFF | 1 |

On the other hand, the outputs of the circuit elements are indicated below, when the read data $RD_k$ is "low".

a high level at the time $t_2$. The signal ADC remains at a high level during a period between the times $t_2$ and $t_4$, so that the output controlling signal $ADC_0$ of the output

| $RD_k$ | INVERTER | INVERTER | NOR | NOR | INVERTER | OR | P-MOS | N-MOS | N-MOS | $EX_k$ |
|---|---|---|---|---|---|---|---|---|---|---|
| 0 | 1 | 0 | 0 | 1 | 1 | 1 | OFF | ON | OFF | 0 |

Meanwhile, the output terminals of the output circuits $10_k$ become a high impedance state, when the chip selecting signal $\overline{CS}$ turns to a high level.

Figure 3:
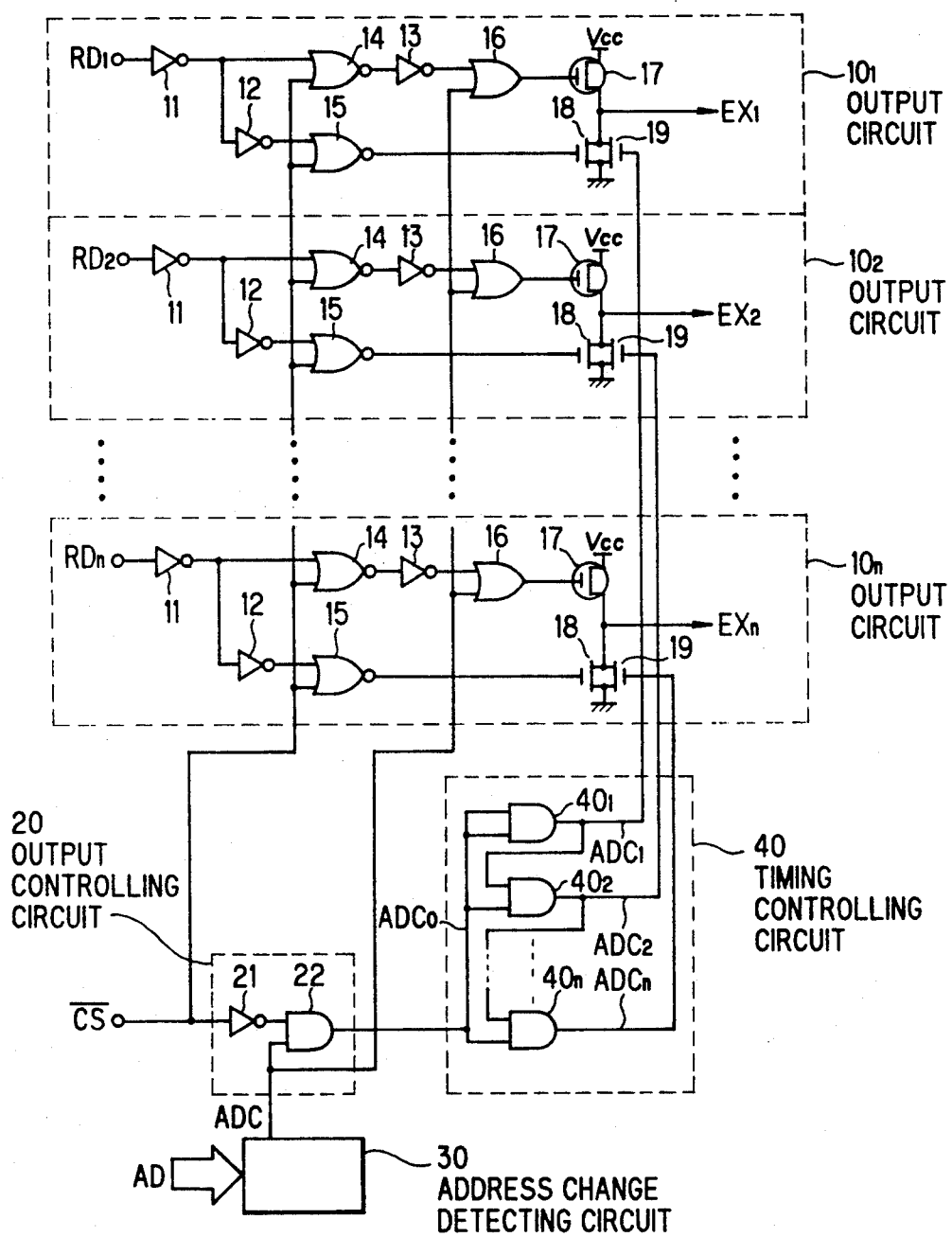
FIG. 3 is a circuit diagram showing an apparatus for controlling outputs of read data in a semiconductor memory device in a preferred embodiment according to the invention.

Next, FIG. 3 shows an apparatus for controlling outputs of read data in a semiconductor memory circuit according to a preferred embodiment of the invention. The apparatus for controlling outputs of read data in a semiconductor memory device comprises a plurality of output circuits $10_1, 10_2, \sim, 10_n$ which supply read data to an external circuit, an output controlling circuit 20 which controls output operation of the output circuits $10_1, 10_2, \sim, 10_n$, an address change detecting circuit 30 which supplies an address change detecting signal ADC to the output controlling circuit 20, and a timing controlling circuit 40 which controls the timing of supplying an output controlling signal of the output controlling circuit 20 to the output circuits $10_1, 10_2, \sim, 10_n$.

Every circuit of the output circuits $10_1, 10_2, \sim, 10_n$ comprises inverters 11, 12 and 13, NOR circuits 14 and 15, an OR circuit 16, a P-MOS transistor 17, and N-MOS transistors 18 and 19. The circuit structure is controlling circuit 20 turns to a high level, and the timing controlling signal $ADC_1$ of the AND circuit $40_1$ also turns to a high level at the time $t_2$. Then, the timing controlling signal $ADC_2$ of the AND circuit $40_2$ turns to a high level, after an interval of an activation time $T_1$ of an AND circuit, at the time $t_2+T_1$. In such a manner, the timing controlling signal $ADC_n$ of the AND circuit $40_n$ turns to a high level, after an interval of the period $T_{n-1}$ behind the turning of the timing controlling signal $ADC_1$ of the AND circuit $40_1$ to a high level, so that the N-MOS transistor 19 turns to an ON state one after another at sequential intervals. As a result, in the simultaneous discharge of the output terminals of the output circuits $10_1, 10_2, \sim, 10_n$, is prevented, so that noises may not be produced.

When the address change detecting signal ADC turns to a low level at the time $t_4$, the N-MOS transistor 19 turns to an OFF state. On the other hand, the chip selecting signal $\overline{CS}$ is at a low level, so that the output signals $EX_1, EX_2, \sim, EX_n$ corresponding to the read data $RD_1$, $RD_2$, ~, $RD_n$ are supplied through the output terminals of the output circuits $10_1$, $10_2$, ~, $10_n$ to the external circuit, as explained in FIGS. 1 and 2. Meanwhile, the output terminals thereof becomes a high impedence state, when the chip selecting signal $\overline{CS}$ turns to a high level.

Although the invention has been described with respect to a specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for controlling outputs of read data in a semiconductor memory device, comprising:
    a plurality of output circuits for supplying read data which are read from a memory to an external circuit, said plurality of output circuits being provided in parallel to carry out parallel outputs of said read data; and
    control means for controlling said plurality of output circuits to carry out discharge of charge accumulated in said plurality of output circuits sequentially with a predetermined time difference by control signals generated in accordance with said predetermined time difference, said charges being accumulated by read data of a high level supplied to said plurality of output circuits prior to said discharge, said control means including a plurality of timing circuits for providing the control signals with said predetermined time difference, said timing circuits corresponding to said output circuits and erasing states stored in said output circuits prior to said discharge, said timing circuits are AND circuits which are connected in serial, such that an output of each AND circuit excluding a final stage-AND circuit is connected to an input of a following stage-AND circuit, each output of said AND circuits being connected to a corresponding one of said output circuits, and a signal requesting a supply of said read data to said external circuit being applied to two inputs of a first stage-AND circuit.

2. An apparatus for controlling outputs of read data in a semiconductor memory device, according to claim 1, further comprising:
    request signal supply means for producing a request signal requesting a supply of said read data to said external circuit, said request signal being supplied to said control means to carry out a time-sequential supply of said read data.

3. An apparatus for controlling outputs of read data in a semiconductor memory device, according to claim 2, wherein:
    said request signal supply means produces said request signal by receiving a chip selecting signal and a memory address change signal.

4. An apparatus for controlling outputs of read data in a semiconductor memory device, according to claim 2, further comprising:
    means for detecting a change of a memory address to produce a memory address change signal which is supplied to said request signal supply means along with a chip selecting signal.

* * * * *